(12) United States Patent
Blanchet et al.

(10) Patent No.: US 9,008,603 B2
(45) Date of Patent: Apr. 14, 2015

(54) INTEGRATED CIRCUIT COMPRISING AN INTEGRATED TRANSFORMER OF THE "BALUN" TYPE WITH SEVERAL INPUT AND OUTPUT CHANNELS

(71) Applicant: STMicroelectronics S.A., Montrouge (FR)

(72) Inventors: Floria Blanchet, Saint Martin D'heres (FR); Christophe Arricastres, Grenoble (FR); Denis Pache, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 200 days.

(21) Appl. No.: 13/707,736

(22) Filed: Dec. 7, 2012

(65) Prior Publication Data

US 2013/0157587 A1    Jun. 20, 2013

(30) Foreign Application Priority Data

Dec. 20, 2011    (FR) ...................................... 11 62017

(51) Int. Cl.
| | |
|---|---|
| H04B 1/10 | (2006.01) |
| H01F 5/00 | (2006.01) |
| H01F 30/04 | (2006.01) |
| H01L 23/522 | (2006.01) |
| H01L 27/01 | (2006.01) |
| H01L 49/02 | (2006.01) |
| H03H 7/42 | (2006.01) |
| H01P 5/10 | (2006.01) |
| H01L 23/66 | (2006.01) |
| H03H 7/01 | (2006.01) |

(52) U.S. Cl.
CPC ................ *H01F 5/003* (2013.01); *H01F 30/04* (2013.01); *H01L 23/5227* (2013.01); *H01L 27/01* (2013.01); *H01L 28/10* (2013.01); *H03H 7/42* (2013.01); *H01P 5/10* (2013.01); *H01L 23/66* (2013.01); *H01L 2223/6655* (2013.01); *H01L 2223/6677* (2013.01); *H01L 2223/6672* (2013.01); *H01L 2924/0002* (2013.01); *H03H 7/1775* (2013.01)

(58) Field of Classification Search
CPC ... H01L 23/5227; H01L 23/645; H03H 7/422
USPC .............................. 455/292, 41.1, 252.1, 333
See application file for complete search history.

(56) References Cited

U.S. PATENT DOCUMENTS

| | | |
|---|---|---|
| 2010/0060402 A1 | 3/2010 | Chen |
| 2011/0241163 A1 | 10/2011 | Liu et al. |

FOREIGN PATENT DOCUMENTS

EP    2204877 A1    7/2010

OTHER PUBLICATIONS

INPI Search Report and Written Opinion for FR1162017 mailed Aug. 21, 2012 (7 pages).

*Primary Examiner* — Eugene Yun
(74) *Attorney, Agent, or Firm* — Gardere Wynne Sewell LLP

(57) ABSTRACT

An integrated circuit includes an integrated transformer of the balanced-to-unbalanced type with N channels, wherein N is greater than 2. The integrated transformer includes, on a substrate, N inductive circuits that are mutually inductively coupled, and respectively associated with N channels.

14 Claims, 3 Drawing Sheets

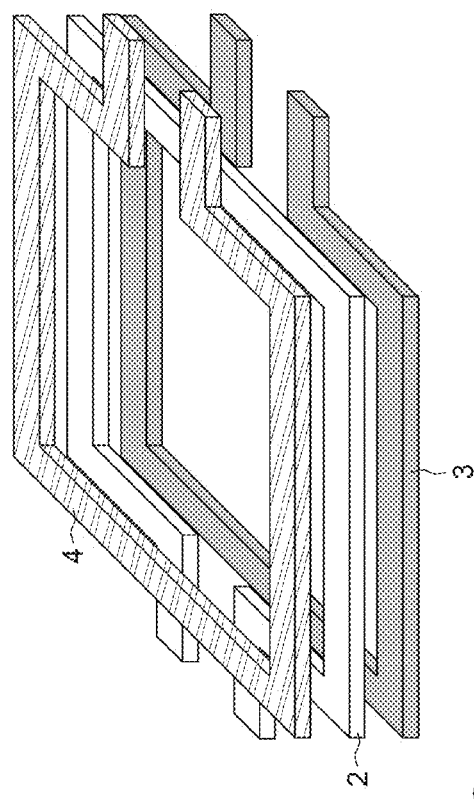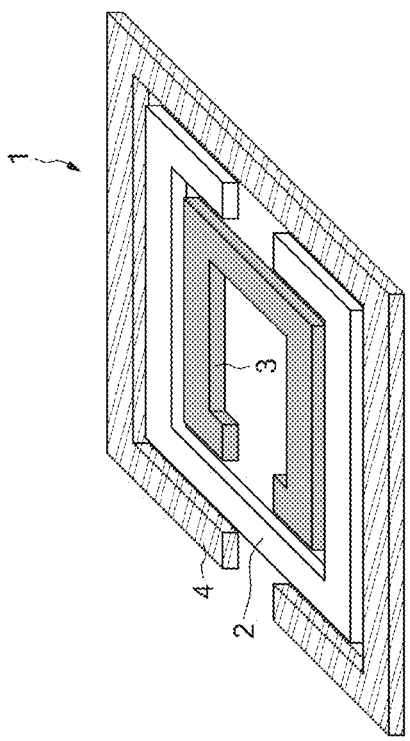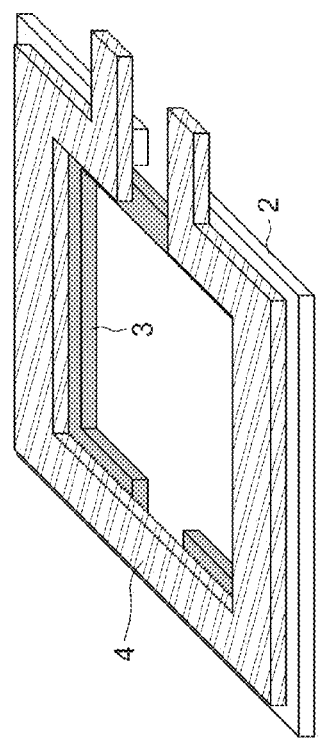

INTEGRATED CIRCUIT COMPRISING AN INTEGRATED TRANSFORMER OF THE "BALUN" TYPE WITH SEVERAL INPUT AND OUTPUT CHANNELS

PRIORITY CLAIM

This application claims priority from French Application for Patent No. 1162017 filed Dec. 20, 2011, the disclosure of which is hereby incorporated by reference.

TECHNICAL FIELD

The invention relates to integrated transformers of the balanced-to-unbalanced type commonly known to those skilled in the art as "BALUN", and more particularly such an integrated transformer comprising a plurality of input/output channels.

The invention applies for example to mobile telephony or to the field of motor vehicle radars.

BACKGROUND

The production of integrated systems made of silicon, whether they are power or processing systems, is increasingly carried out with differential structures and structures of variable reference impedance for the analogue portions. The "outside" world for its part remains essentially a system of the common-mode type and with 50Ω reference impedance.

The connection between a balanced transmission line and an unbalanced transmission line cannot be made without an appropriate electric circuit. This transition is provided by a transformer of the balanced-to-unbalanced type called a "balun".

A balun converts, for example, a signal of the common-mode type into a signal of the differential mode type and vice versa, and performs the impedance transformations. The main electrical characteristics of a balun are its insertion loss, which must be as low as possible, the balancing of the differential channels in phase (180°) and in amplitude ($\delta$=0 dB), and its bandwidth, that is to say the range of frequencies on which the transformer can be used as a "balun" with a balancing of the channels in phase and in amplitude.

Baluns can also be used, for example, in receive and transmit circuits of wireless communication systems, for the design of differential circuits such as amplifiers, mixers, oscillators and antenna systems.

Baluns can be made with transmission lines such as Lange couplers, couplers of the ring type commonly known to those skilled in the art as "Rat-race" couplers, or Marchand couplers, or else couplers with stacked or coplanar inductors.

In the structures with transmission lines, lines of a length equivalent to a quarter wavelength, $\lambda/4$, or a half wavelength, $\lambda/2$, are used for isolations between channels and to produce the delay of one channel relative to the other. As an example, for frequencies of 2 GHz and 80 GHz, and for a metallic line resting on a material having a constant dielectric $\in r$ equal to 4, the length values $\lambda/4$ and $\lambda/2$ correspond to 18.75 mm and 37.5 mm for 2 GHz and 0.468 mm and 0.937 mm for 80 GHz.

Consequently, this transmission-line structure has the drawback of occupying a large area of silicon for microwave applications or of not being integratable for lower-frequency applications. For this reason, the inductor-based structures are preferably used.

Usually, the baluns that are used have one input channel and one output channel; they are called "two-channel baluns". In some cases, however, several outputs are necessary. This is the case, for example, with a transceiver circuit.

Beginning with a two-channel balun comprising a primary inductive circuit coupled to an antenna for example and a secondary inductive circuit, for producing a transceiver device, it is necessary to couple a Power Amplifier (PA) to the secondary inductive circuit for the transmission of signals and a Low Noise Amplifier (LNA) for the reception of signals and for minimizing the line losses.

However, the coupling of the power amplifier PA and of the low-noise amplifier LNA to the secondary inductive circuit involves coupling the power amplifier PA and the low-noise amplifier LNA together. When the power amplifier PA is operating, its output voltage is high, typically from zero to twice the power supply voltage of the circuit. This high voltage is then directly applied to the gates of the transistors of the low-noise amplifier LNA and induces a considerable risk of destroying these transistors.

To prevent such damage, it is known practice, in a first configuration illustrated in FIG. 1a, to use several baluns $B_1$ and $B_2$. The use of a plurality of baluns $B_1$ and $B_2$ to multiply the number of channels results in a considerable increase in the area of silicon occupied. For example, in the case of using two baluns $B_1$ and $B_2$ in order to have two output channels and different transformation ratios, the total area occupied by the circuit comprising two baluns is doubled.

Moreover, in such a configuration in which two baluns are placed side by side, a capacitive coupling appears between the two baluns and more particularly between the primary inductive circuits $I_1$ and the secondary inductive circuits $I_2$ of the two baluns $B_1$ and $B_2$. This capacitive coupling may cause an imbalance of the channels.

Furthermore, as illustrated in FIG. 1a showing a transceiver circuit using two baluns $B_1$ and $B_2$, the circuit must comprise a set of switches S on the primary inductive circuit $I_1$ in order to make the circuit operate in transmit mode or in receive mode.

However, such a configuration does not make it possible to carry out duplexing, that is to say to have the system operate in transmit and receive mode simultaneously.

Moreover, the switches S introduce an additional loss factor resulting, for the transceiver circuit, in lower efficiency in transmit mode and a lower gain in receive mode. Moreover, it is necessary to use a circuit for controlling the switches S. The circuit for controlling the switches S then introduces a factor of additional risk relating to the reliability of the switches S that may cause the circuit not to function.

In another configuration that is known and is illustrated in FIG. 1b, it is possible to use a single balun, but for which it is necessary to add commutator switches S to the secondary inductive circuit $I_2$ between the power amplifier PA of transmit mode and the low-noise amplifier LNA of receive mode.

This configuration also does not make duplexing possible because of the alternating operation between transmit and receive.

Moreover, the switches S introduce an overall power loss and a reduction in efficiency of the power amplifier PA, and a degradation of the noise factor and a degradation of the overall gain of the low-noise amplifier LNA. Moreover, it is also necessary, in this configuration, to use a circuit for controlling the switches S which introduces an additional risk factor relating to the reliability of the switches S.

Moreover, the transformation ratio of a two-channel balun is fixed. The outputs on the side of the power amplifier PA or on the side of the low-noise amplifier LNA are necessarily differential or single-channel, but it is impossible to have a differential impedance on the side of the low-noise amplifier LNA and single-channel on the side of the power amplifier PA and vice versa.

SUMMARY

According to one embodiment, a balun architecture is proposed with multiple input and/or output channels with the aim, on the one hand, of reducing the area of silicon used by the balun, and on the other hand of providing different transformation ratios between transmit and receive, and of reducing the capacitive coupling between the baluns and of avoiding the use of components introducing additional performance losses.

According to one aspect, in one embodiment, an integrated circuit is proposed that comprises an integrated transformer of the balanced-to-unbalanced type with N channels comprising, on a substrate, N inductive circuits that are mutually inductively coupled and respectively associated with N channels.

In this configuration therefore there is only one inductive circuit per channel which makes it possible to prevent the use of commutating switches introducing additional noise and additional power losses and to dispense with the problems of overvoltage encountered when different electronic devices are electrically coupled to one and the same inductive circuit. Each channel has an inductive circuit inductively coupled with the inductive circuits of each of the other channels of the integrated transformer.

Preferably, the integrated circuit comprises m primary inductive circuits, m being greater than or equal to 1, and N-m secondary inductive circuits.

Such a device therefore makes it possible to have, for example, a three-channel integrated transformer with one primary inductive circuit and two secondary inductive circuits and thus makes it possible to have duplexing operation of the system.

Advantageously, at least one channel may comprise at least one reactance connected in parallel to the corresponding inductive circuit.

The parallel coupling of a reactive element, such as a capacitor, with a primary or secondary inductive circuit makes it possible to adjust the impedance of the said inductive circuit and thus to optimize the characteristics of the integrated transformer so as to optimize its performance.

At least two inductive circuits can advantageously be coplanar.

At least one of the coplanar inductive circuits can advantageously be interleaved in one of the other coplanar circuits.

Advantageously, at least one inductive circuit can be stacked on at least one other inductive circuit.

The primary inductive circuits and the secondary inductive circuits may all be coplanar, or all stacked on one another. In one variant, it is also possible to have a primary or secondary inductive circuit or a group of at least two coplanar primary or secondary inductive circuits, the said inductive circuit or the said group being stacked on a group of coplanar primary or secondary inductive circuits or else on a single primary or secondary inductive circuit. All the combinations that can be derived are possible.

According to another aspect, in one embodiment, a transceiver device is proposed comprising an antenna, a transmit channel comprising a power amplifier, a receive channel comprising a low-noise amplifier and an integrated circuit defined above of which the integrated transformer comprises a first inductive circuit connected to the antenna, a second inductive circuit coupled to the transmit channel and a third inductive circuit coupled to the receive channel.

According to another aspect, a wireless communication device is proposed that comprises a transceiver device defined above.

BRIEF DESCRIPTION OF THE DRAWINGS

Other advantages and features of the invention will appear on examination of the detailed description of embodiments, that are in no way limiting, and of the appended drawings in which:

FIGS. 3a to 3c each represent schematically a view in perspective of an example of an integrated transformer according to three embodiments.

DETAILED DESCRIPTION OF THE DRAWINGS

Figure 1A:
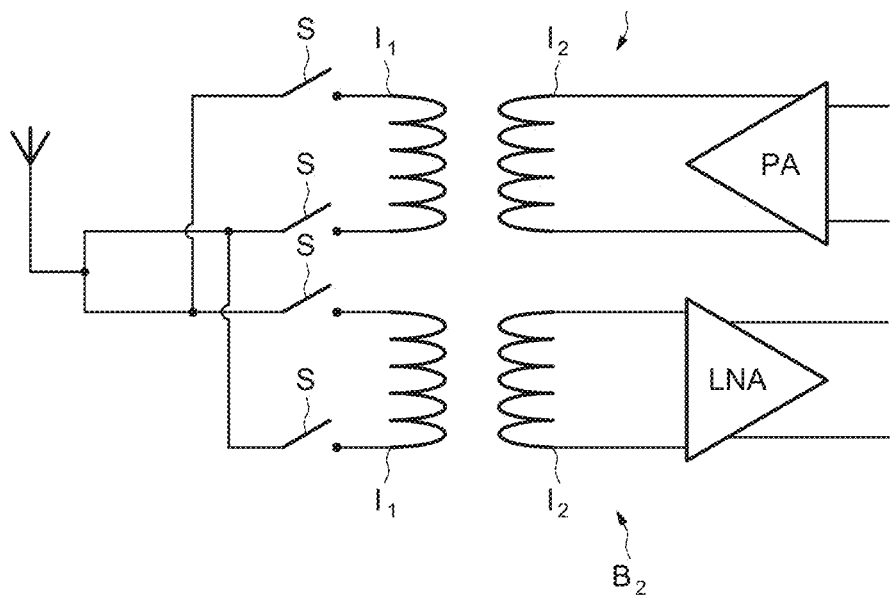
FIGS. 1a and 1b, already described, describe two known embodiments of a balun transformer with two output channels.
Figure 1B:
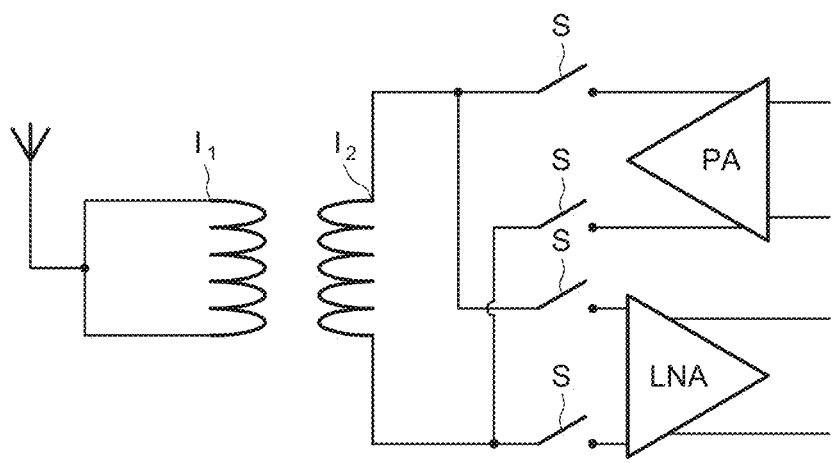
Figure 2:
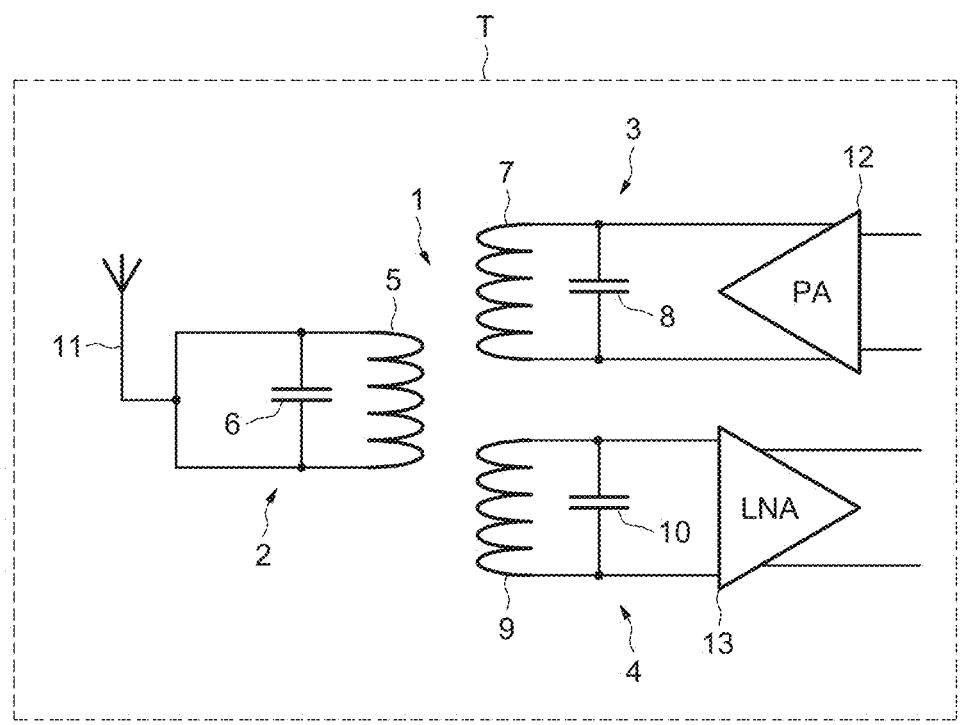
FIG. 2 shows schematically a transceiver device comprising an integrated circuit comprising an integrated transformer according to one embodiment.

FIG. 2 shows schematically a transceiver device T capable of being installed in a wireless communication device. The transceiver device T shown comprises an integrated circuit comprising an integrated transformer of the "balun" type according to one embodiment.

The transformer 1 comprises a primary inductive circuit 2, a first secondary inductive circuit 3 and a second secondary inductive circuit 4. The primary inductive circuit 2 is formed, in this example, of a primary coil 5 coupled in parallel to a primary capacitor 6. The first secondary inductive circuit 3 is formed of a first secondary coil 7 coupled in parallel to a first secondary capacitor 8. The second secondary inductive circuit 3 is formed of a second secondary coil 9 coupled in parallel to a second secondary capacitor 10.

The primary inductive circuit 2 and the first and second secondary inductive circuits 3 and 4 are mutually inductively coupled. For example, for a balun intended for mobile telephony applications having a power of 1 Watt at 52.5 GHz, a dimension of 400 µm by 400 µm, a primary coil 5 of 4.9 nH, a first secondary coil 7 of 1.32 nH and a second secondary coil 9 of 1.22 nH, there are coupling coefficients of K1=−0.61 between the primary coil 5 and the first secondary coil 7, K2=−0.46 between the primary coil 5 and the second secondary coil 9, and K3=−0.61 between the first secondary coil 7 and the second secondary coil 9.

The primary coil 5 and the primary capacitor 6 of the primary inductive circuit 2 are coupled to an antenna capable of transmitting and receiving data signals.

The first secondary coil 7 and the first secondary capacitor 8 of the first secondary inductive circuit 3 are coupled to the output of a power amplifier 12 capable of being coupled at the input to a device for generating signals to be transmitted. During the transmission of data signals by the integrated circuit comprising the transformer 1, the power amplifier 12 receives signals to be transmitted that it amplifies before transferring them via the first secondary coil 7 and the primary coil 5 to the antenna 11 so that the latter transmits them.

The second secondary coil 9 and the second secondary capacitor 10 of the second secondary inductive circuit 4 are coupled to the input of a low-noise amplifier 13 capable of being coupled at the output to a device for processing received signals. During the reception of data signals by the antenna 11, the signals are transferred via the primary coil 5 and the second secondary coil 9 to the low-noise amplifier 13.

Each capacitor 6, 8 and 10 coupled in parallel to an inductor makes it possible to adjust the impedance of the inductive circuit to which it is coupled. Therefore, the dimensions of the capacitors vary depending on the performance characteristics that are desired for the integrated transformer 1. A primary or secondary inductive circuit may have no capacitor if the impedance of the primary or secondary inductive circuit makes it possible to obtain the desired performance.

In variants, it is possible to add additional primary inductive circuits in order to multiply the input channels and to multiply for example the antennas.

FIGS. 3a to 3c show schematically views in perspective of examples of an integrated transformer of the "balun" type according to three embodiments, produced within an integrated circuit.

In the embodiment illustrated in FIG. 3a, the transformer 1 of balun type comprises a primary inductive circuit 2, a first secondary inductive circuit 3 and a second secondary inductive circuit 4, all three situated in one and the same plane, for example on one and the same metallization level of the integrated circuit. In this configuration, the primary inductive circuit 2 is interleaved between the first secondary inductive circuit 3 and the second secondary inductive circuit 4. The first secondary inductive circuit 3 is interleaved inside the primary inductive circuit 2, while the primary inductive circuit 2 is interleaved in the second secondary inductive circuit 4.

The connections of the inductive circuits 2, 3 and 4 are produced so as to pass into a plane different from the plane comprising the three inductive circuits. This is, for example, achieved by vias and metallic line junctions situated at an initial lower or higher level.

The dimensions of each of the primary or secondary inductive circuits have an influence on the impedance of the inductive circuit. Consequently, the performance of the integrated transformer 1 depends on the dimensions of the primary inductive circuit 2 and on the first and second secondary inductive circuits 3 and 4.

In the embodiment illustrated in FIG. 3b, the primary inductive circuit 2, the first secondary inductive circuit 3 and the second secondary inductive circuit 4 of the integrated transformer 1 are stacked one on top of the other. The primary inductive circuit 2 is placed between the first secondary inductive circuit 3 and the second secondary inductive circuit 4.

In the embodiment illustrated in FIG. 3c, the primary inductive circuit 2 and the first secondary inductive circuit 3 are coplanar, the first secondary inductive circuit 2 being interleaved in the primary inductive circuit 3. The second secondary inductive circuit 4 is stacked onto the assembly formed by the primary inductive circuit 2 and the first secondary inductive circuit 3. Any other stacking is also possible.

Performance comparison tests have been carried out between the transformers of the prior art and an integrated transformer described herein.

First of all, in the case of a two-channel balun, known in the prior art, for an impedance induced on the power amplifier of 198 ohms with a frequency of 6.7 nH, the losses of the balun are 1.18 dB making it possible to obtain an efficiency of 23.6%. By having a two-channel balun operate with switches, the latter introduce new losses of 0.52 dB resulting in obtaining a lower efficiency (21.6%) of the transformer.

For a three-channel balun having an impedance induced on the power amplifier of 198 ohms at 6.7 nH, and produced according to one embodiment described herein, that is to say with no switch, the performance of the balun makes it possible to obtain an efficiency of 23.7% equal to the efficiency of a two-channel balun with no switch.

Furthermore, by virtue of a three-channel balun produced according to one embodiment described herein, it is possible to synthesize various loads induced on the power amplifier, while reducing a fixed impedance on the low-noise amplifier. Therefore, for a fixed impedance of 50 ohms on the low-noise amplifier, it is possible to have, by modifying the value of the capacitor coupled to the inductive circuit coupled to the power amplifier for example, an impedance induced on the power amplifier of 198 ohms at 6.7 nH or 250 ohms at 6.7 nH or 198 ohms at 6 nH. For these three different impedances, the losses measured on the balun were identical (1.16 dB).

On the other hand, by modifying these impedances, the efficiency of the balun is modified by 23.7% for an impedance induced on the power amplifier of 198 ohms at 6.7 nH at an efficiency of 28.6% for an impedance of 250 ohms at 6.7 nH and an efficiency of 16% for an impedance of 198 ohms at 6 nH.

Other measurements have also made it possible to establish that the use of no switches in the multichannel balun according to one embodiment of the invention made it possible to improve the noise factor and the gain. Specifically, for an impedance induced on the low-noise amplifier of 100 ohms, the switches introduce a loss of 0.7 on a gain of 20 dB and alter the noise factor from a coefficient of 1.5 (with no switch) to a coefficient of 2.2 (with switches).

The integrated transformer proposed according to the embodiments described herein therefore makes it possible to carry out duplexing, to increase the performance of the power amplifier by adapting the induced load and to avoid deterioration of the noise factor for the low-noise amplifier by removing the control switches. It also makes it possible to increase the reliability of the circuit relative to an integrated transformer using control switches. It also provides the possibility of having different transformation ratios between the antenna and the power amplifier and between the antenna and the low-noise amplifier and the possibility of having a differential or single-channel operation on the power amplifier and the low-noise amplifier.

Moreover, the use of a single balun to have different transformation ratios makes it possible to reduce the total area of the circuit used.

The integrated transformer proposed according to the embodiments described herein also makes it possible to reduce the capacitive coupling between the low-noise amplifier and the power amplifier and thus improve the balance of the channels.

Finally, the number of channels of the integrated transformer that is proposed is not limited. Specifically it may be extended to four or five channels or more.

What is claimed is:

1. An integrated circuit, comprising:
    an integrated transformer of the balanced-to-unbalanced type with three channels, the integrated transformer comprising three inductive circuits on a substrate that are mutually-inductively coupled, and respectively associated with the three channels, wherein a first one of the inductive circuits includes a first set of terminals configured for connection to an antenna, wherein a second one of the inductive circuits includes a second set of terminals configured for connection to an output of a signal transmitting circuit and a third one of the inductive circuits includes a third set of terminals configured for connection to an input of a signal receiving circuit, the integrated transformer supporting duplexed signal use of the antenna by the signal transmitting and signal receiving circuits.

2. The integrated circuit according to claim 1, wherein at least one channel comprises at least one capacitor connected in parallel to the corresponding inductive circuit.

3. The integrated circuit according to claim 1, wherein at least two of the three inductive circuits are coplanar.

4. The integrated circuit according to claim 3, wherein at least one of the at least two coplanar inductive circuits is interleaved in one of the other at least two coplanar inductive circuits.

5. The integrated circuit according to claim 1, wherein at least one of the three inductive circuits is stacked on at least one other of the three inductive circuits.

6. A transceiver device, comprising:
   an antenna,
   a power amplifier transmit circuit,
   a low-noise amplifier receive circuit, and
   an integrated transformer of the balanced-to-unbalanced type with three channels, the integrated transformer comprising three inductive circuits supported on an integrated circuit substrate that are mutually-inductively coupled, and respectively associated with the three channels,
   wherein the integrated transformer comprises a first inductive circuit having a first pair of terminals connected to the antenna, a second inductive circuit having a second pair of terminals coupled to an output of the power amplifier transmit circuit and a third inductive circuit having a third pair of terminals coupled to an input of the low-noise amplifier receive circuit.

7. The transceiver device according to claim 6, wherein the transceiver device is a wireless communication device.

8. The transceiver device according to claim 6, wherein the inductive circuits, power amplifier transmit circuit and low-noise amplifier receive circuit are supported by said integrated circuit substrate.

9. The transceiver device of claim 8, wherein the inductive circuits are formed in one or more metallization layers overlying the integrated circuit substrate.

10. The transceiver device of claim 8, wherein each inductive circuit comprises a circuit loop.

11. The transceiver device of claim 10, wherein at least two of the circuit loops of the inductive circuits are interleaved.

12. The transceiver device of claim 10, wherein at least two of the circuit loops of the inductive circuits are stacked.

13. The transceiver device of claim 8, further including at least one capacitor coupled in parallel with at least one of the inductive circuits.

14. The transceiver device according to claim 6, wherein the integrated transformer supports duplexed signal use of the antenna by the power amplifier transmit circuit and the low-noise amplifier receive circuit.

* * * * *